United States Patent
Lee et al.

(10) Patent No.: US 9,041,189 B2
(45) Date of Patent: May 26, 2015

(54) SEMICONDUCTOR PACKAGE AND METHOD OF FABRICATING THE SAME

(71) Applicant: Siliconware Precision Industries Co., Ltd., Taichung (TW)

(72) Inventors: Meng-Tsung Lee, Taichung (TW); Chiang-Cheng Chang, Taichung (TW); Shih-Kuang Chiu, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 63 days.

(21) Appl. No.: 13/659,181

(22) Filed: Oct. 24, 2012

(65) Prior Publication Data
US 2014/0015125 A1     Jan. 16, 2014

(30) Foreign Application Priority Data
Jul. 11, 2012   (TW) .............................. 101124878 A

(51) Int. Cl.
*H01L 23/538* (2006.01)
*H01L 21/00* (2006.01)

(52) U.S. Cl.
CPC ............. *H01L 21/00* (2013.01); *H01L 2224/82* (2013.01); *H01L 2924/15153* (2013.01)

(58) Field of Classification Search
CPC ................................................ H01L 24/15153
USPC .................................... 257/E23.125, E23.178
See application file for complete search history.

(56) References Cited

U.S. PATENT DOCUMENTS

| | | | | |
|---|---|---|---|---|
| 6,159,767 A * | 12/2000 | Eichelberger | ................. | 438/107 |
| 6,639,324 B1 * | 10/2003 | Chien | ............. | 257/778 |
| 6,865,089 B2 * | 3/2005 | Ho et al. | ................ | 361/761 |
| 7,417,299 B2 * | 8/2008 | Hu | ................ | 257/528 |
| 8,119,454 B2 * | 2/2012 | Jin | ................ | 438/118 |
| 8,304,896 B2 * | 11/2012 | England | ............ | 257/700 |
| 8,541,877 B2 * | 9/2013 | Tsai et al. | .............. | 257/738 |
| 2003/0134455 A1 * | 7/2003 | Cheng et al. | ............. | 438/125 |
| 2005/0121770 A1 * | 6/2005 | Baek et al. | .............. | 257/698 |

* cited by examiner

*Primary Examiner* — John C Ingham
(74) *Attorney, Agent, or Firm* — Mintz Levin Cohn Ferris Glovsky and Popeo, P.C.; Peter F. Corless; Steven M. Jensen

(57) ABSTRACT

A method of fabricating a semiconductor package is provided, including: providing a carrier having a plurality of chip areas defined thereon, and forming a connection unit on each of the chip areas; disposing a semiconductor element on each of the connection units; forming an insulating layer on the carrier and the semiconductor elements; and forming on the insulating layer a circuit layer electrically connected to the semiconductor elements. Since being formed only on the chip areas instead of on the overall carrier as in the prior art, the connection units are prevented from expanding or contracting during temperature cycle, thereby avoiding positional deviations of the semiconductor elements.

19 Claims, 5 Drawing Sheets

SEMICONDUCTOR PACKAGE AND METHOD OF FABRICATING THE SAME

CROSS-REFERENCES TO RELATED APPLICATIONS

This application claim under 35 U.S.C. §119(a) the benefit of Taiwanese Application No. 101124878, filed Jul. 11, 2012, the entire contents of which is incorporated herein by reference.

BACKGROUND OF THE INVENTION

1. Field of the Invention

The present invention relates to semiconductor packages and methods of fabricating the same, and, more particularly, to a wafer-level semiconductor package and a method of fabricating the same.

2. Description of Related Art

Along with the rapid development of electronic industries, electronic products are developed towards multi-function and high electrical performance. Accordingly, wafer level packaging (WLP) technologies have been developed to meet the miniaturization requirement of semiconductor packages.

FIGS. 1A to 1D are schematic cross-sectional views showing a method of fabricating a wafer-level semiconductor package 1 according to the prior art.

Referring to FIG. 1A, a thermal release tape 11 is formed on a carrier 10, and a plurality of semiconductor elements 12 are disposed on the thermal release tape 11. Each of the semiconductor elements 12 has an active surface 12a with a plurality of electrode pads 120 disposed thereon and a non-active surface 12b opposite to the active surface 12a. Each of the semiconductor elements 12 is disposed on the thermal release tape 11 through the active surface 12a thereof.

Referring to FIG. 1B, an encapsulant 15 is formed on the thermal release tape 11 by molding so as to encapsulate the semiconductor elements 12.

Referring to FIG. 1C, a curing process is performed to cure the encapsulant 15. Meanwhile, the thermal release tape 11 loses its adhesive property when being heated. As such, the thermal release tape 11 and the carrier 10 can be removed together to expose the active surfaces 12a of the semiconductor elements 12.

Referring to FIG. 1D, a Redistribution layer (RDL) process is performed such that an RDL structure 16 is formed on the encapsulant 15 and the active surfaces 12a of the semiconductor elements 12 for electrically connecting the electrode pads 120 of the semiconductor elements 12.

Then, an insulating layer 17 is formed on the RDL structure 16, and a plurality of openings are formed in the insulating layer 17 such that a portion of the RDL structure 16 is exposed for solder balls 18 to be mounted thereon.

However, the thermal release tape 11 easily expands when being heated during the molding process, thus easily causing positional deviations of the semiconductor elements 12 attached to the thermal release tape 11 (that is, the positions of the semiconductor elements 12 are deviated from the chip areas B), as shown in FIG. 1D'. The larger the size of the carrier 10 is, the greater the positional deviation of the semiconductor elements 12 becomes, thus adversely affecting the electrical connection between the RDL structure 16 and the semiconductor elements 12 and resulting in a low product yield.

Therefore, there is a need to provide a semiconductor package and a fabrication method thereof so as to overcome the above-described drawbacks.

SUMMARY OF THE INVENTION

In view of the above-described drawbacks, the present invention provides a semiconductor package, which comprises: a semiconductor element having an active surface with a plurality of electrode pads, a non-active surface opposite to the active surface, and side surfaces connecting the active surface and the non-active surface; an insulating layer formed on the active surface and the side surfaces of the semiconductor element and having a plurality of openings for exposing the electrode pads; and a circuit layer formed on the insulating layer and electrically connected to the electrode pads.

In an embodiment, the insulating layer is made of silicon dioxide or silicon nitride.

In an embodiment, the non-active surface of the semiconductor element is exposed form the insulating layer.

In an embodiment, the non-active surface of the semiconductor element is free from being coplanar with the insulating layer.

The present invention further provides a method of fabricating a semiconductor package, which comprises: providing a carrier having a plurality of chip areas defined thereon, and forming a connection unit on each of the chip areas; disposing a semiconductor element on each of the connection units, wherein the semiconductor element has an active surface with a plurality of electrode pads, a non-active surface opposite to the active surface, and side surfaces connecting the active surface and the non-active surface, the semiconductor element being disposed on the connection unit through the non-active surface thereof; forming an insulating layer on the carrier and the active surfaces and the side surfaces of the semiconductor elements, and exposing the electrode pads from the insulating layer; and forming on the insulating layer a circuit layer electrically connected to the electrode pads.

In an embodiment, the connection units are made of an adhesive material and formed by screen printing, dispensing or patterning.

In an embodiment, the method further comprises removing the carrier and the connection units.

In an embodiment, a redistribution layer (RDL) structure is formed on the insulating layer and the circuit layer and electrically connected to the circuit layer.

In an embodiment, a dielectric layer is formed on the insulating layer and the circuit layer and have a plurality of openings for exposing portions of the circuit layer so as for an under bump metallurgy (UBM) layer to be formed thereon.

In an embodiment, a dielectric layer is formed to encapsulate the semiconductor element, the insulating layer and the circuit layer, wherein the dielectric layer has opposite first and second surfaces and is in contact with the insulating layer through the second surface thereof.

In an embodiment, the insulating layer extends from the active surface of the semiconductor element along the side surfaces of the semiconductor element to the second surface of the dielectric layer, and the circuit layer has a plurality of conductive pads formed on the second surface of the dielectric layer and being lower than the active surface of the semiconductor element. Further, the first surface of the dielectric layer has a plurality of openings for exposing the conductive pads.

According to the present invention, since being formed only on the chip areas instead of on the overall carrier as in the prior art, the connection units are prevented from expanding or contracting as temperature changes. Therefore, the semiconductor elements can be positioned accurately during subsequent processes so as to ensure effective electrical connections between the circuit layer and the semiconductor elements, thus improving the product yield.

DETAILED DESCRIPTION OF PREFERRED EMBODIMENTS

The following illustrative embodiments are provided to illustrate the disclosure of the present invention, these and other advantages and effects can be apparent to those in the art after reading this specification.

It should be noted that all the drawings are not intended to limit the present invention. Various modification and variations can be made without departing from the spirit of the present invention. Further, terms, such as "on", "first", "second", "a" etc., are merely for illustrative purpose and should not be construed to limit the scope of the present invention.

FIGS. 2A to 2G are schematic cross-sectional views showing a method of fabricating a semiconductor package 2 according to a first embodiment of the present invention.

Figure 1A:
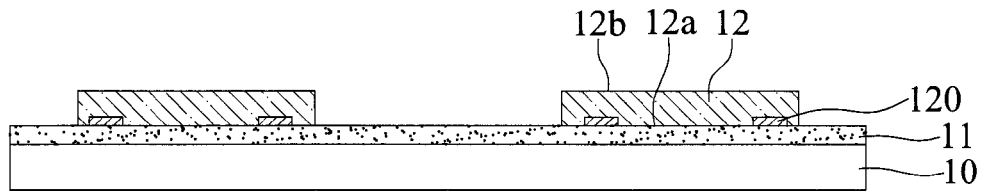
FIGS. 1A to 1D are schematic cross-sectional views showing a method of fabricating a semiconductor package according to the prior art, wherein FIG. 1D' is an upper view of FIG. 1C.
Figure 1B:
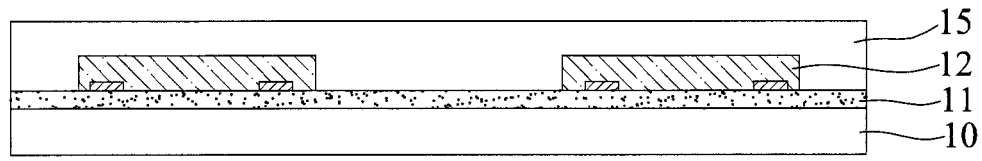
Figure 1C:
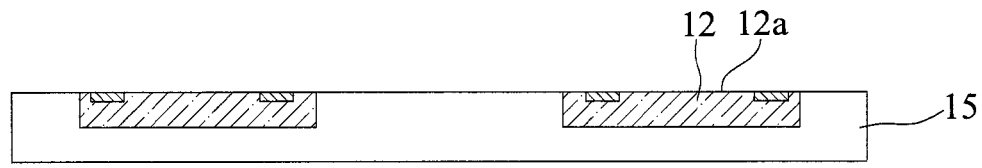
Figure 1D:
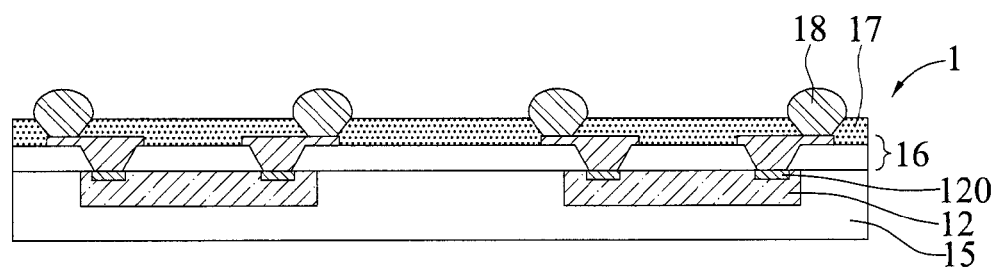
Figure 1D:
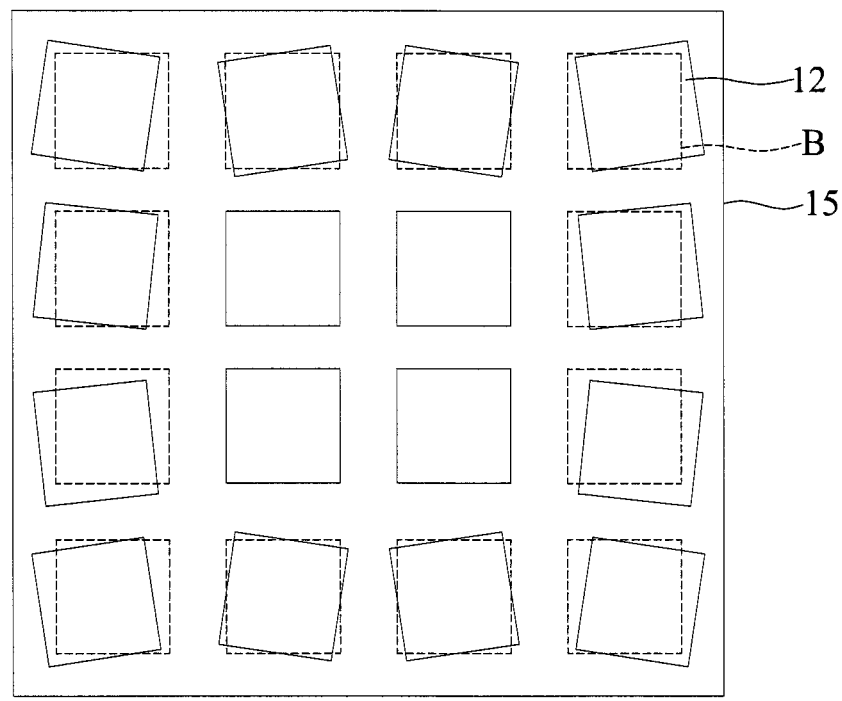
Figure 2A:
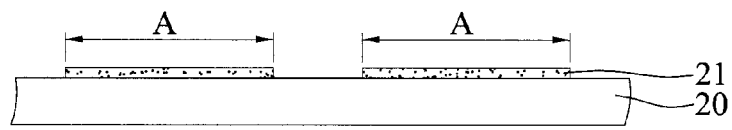
FIGS. 2A to 2G are schematic cross-sectional views showing a method of fabricating a semiconductor package according to a first embodiment of the present invention, wherein FIG. 2A' is an upper view of FIG. 2A, and FIG. 2F' shows another embodiment of FIG. 2F.
Figure 2A:
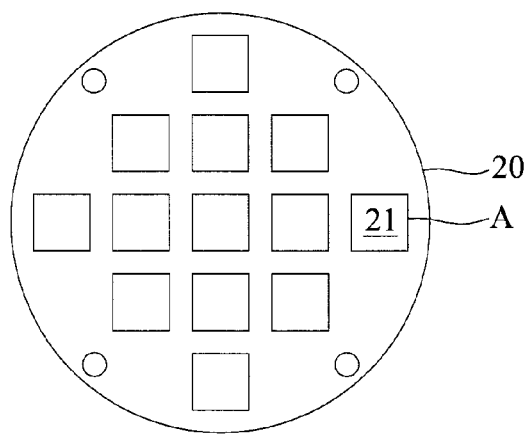

Referring to FIGS. 2A and 2A', a carrier 20 is provided with a plurality of chip areas A defined thereon. A plurality of connection units 21 are formed on the chip areas A.

In an embodiment, the connection units 21 are made of an adhesive material and formed by screen printing or dispensing. Alternatively, the connection units 21 are made of a photosensitive adhesive material and formed by patterning.

Figure 2B:
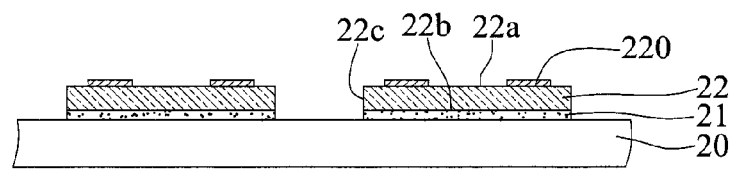

Referring to FIG. 2B, a plurality of semiconductor elements 22 are disposed on the connection units. Each of the semiconductor elements 22 has an active surface 22a with a plurality of electrode pads 220, a non-active surface 22b opposite to the active surface 22a, and side surfaces 22c connecting the active surface 22a and the non-active surface 22b.

Each of the semiconductor elements 22 is disposed on the corresponding connection unit 21 through the non-active surface 22b thereof.

Figure 2C:
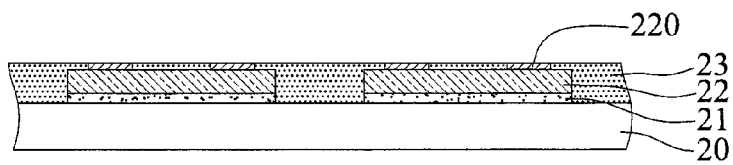

Referring to FIG. 2C, an insulating layer 23 is formed on the carrier 20 and the semiconductor elements 22 through a chemical vapor deposition (CVD) process. The insulating layer 23 has a plurality of openings for exposing the electrode pads 220.

In an embodiment, the electrode pads 220 are flush with the insulating layer 23 so as to be exposed from the insulating layer 23.

The insulating layer 23 is a passivation layer, which can be made of silicon dioxide or silicon nitride.

Figure 2D:
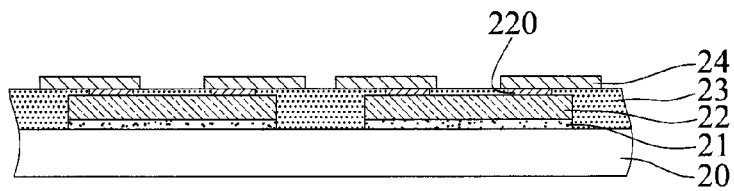

Referring to FIG. 2D, a circuit layer 24 is formed on the insulating layer 23 for electrically connecting the electrode pads 220.

According to the present invention, the connection units 21, since only being formed on the chips area A, are prevented from expanding or contracting during temperature cycle, thereby avoiding positional deviations of the semiconductor elements 22. Further, when the size of the carrier 20 increases, the positional deviation between the semiconductor elements 22 does not increase. Therefore, the position of the semiconductor elements 22 can be accurately controlled so as to ensure effective electrical connections between the circuit layer 24 and the semiconductor elements 22, thus improving the product yield.

Figure 2E:
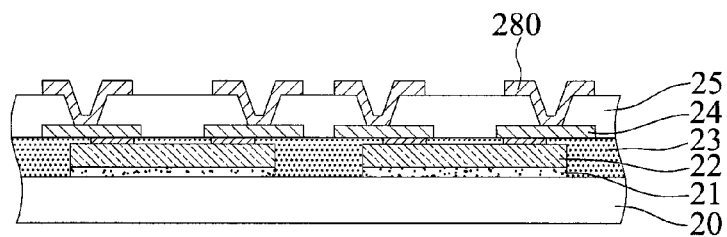

Referring to FIG. 2E, a dielectric layer 25 is formed on the insulating layer 23 and the circuit layer 24. The dielectric layer 25 has a plurality of openings for exposing portions of the circuit layer 24 and an under bump metallurgy (UBM) layer 280 is formed in each of the openings and around the periphery of each of the openings.

In an embodiment, the dielectric layer 25 is made of polyimide (PI) or benzocyclobutene (BCB).

Figure 2F:
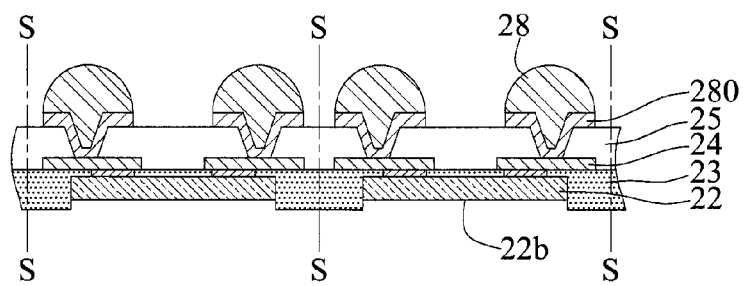
Figure 2F:
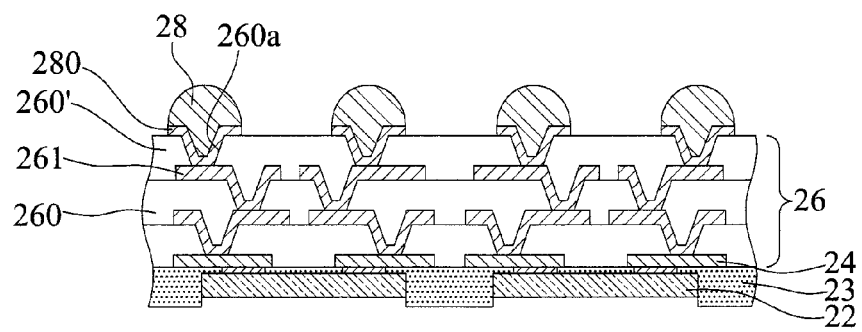

Referring to FIG. 2F, a plurality of conductive elements such as solder balls 28 are formed on the UBM layer 280, and the carrier 20 and the connection units 21 are removed to expose the non-active surfaces 22b of the semiconductor elements 22 and the insulating layer 23.

In an embodiment, the non-active surfaces 22b of the semiconductor elements 22 are not coplanar with the insulating layer 23.

In another embodiment, referring to FIG. 2F', an RDL process is performed to form an RDL structure 26 on the insulating layer 23 and the circuit layer 24. The RDL structure 26 can have multi-layer circuit structures. The RDL structure 26 has a plurality of dielectric layers 260 and a plurality of circuits 261 formed on the dielectric layers 260 and electrically connected to the circuit layer 24. Further, a plurality of openings 260a are formed in the outermost dielectric layer 260' to expose a portion of the circuits 261. Furthermore, a UBM layer 280 is formed on the exposed portion of the circuits 261, and a plurality of conductive elements such as solder balls 28 are further formed on the UBM layer 280.

Figure 2G:
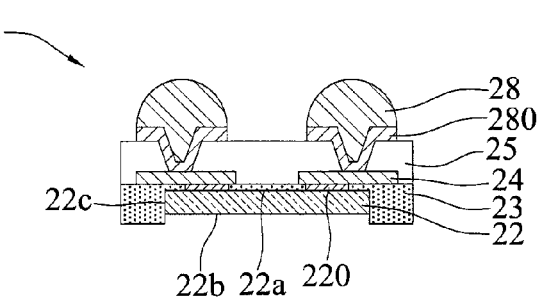

Referring to FIG. 2G, a singulation process is performed along cutting paths S of FIG. 2F so as to form a plurality of semiconductor packages 2.

FIGS. 3A to 3D are schematic cross-sectional views showing a method of fabricating a semiconductor package according to a second embodiment of the present invention. The second embodiment differs from the first embodiment in the configuration of the circuit layer 34.

Figure 3A:
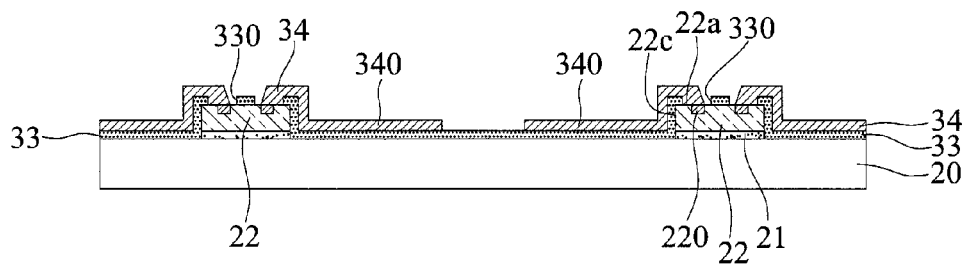
FIGS. 3A to 3D are schematic cross-sectional views showing a method of fabricating a semiconductor package according to a second embodiment of the present invention, wherein FIG. 3D' shows another embodiment of FIG. 3D.

Referring to FIG. 3A, continued from FIG. 2B, an insulating layer 33 is formed to extend from the active surface 22a of each of the semiconductor elements 22 along the side surfaces 22c of the semiconductor element 22 to the carrier 20. In an embodiment, the insulating layer 33 has a plurality of openings 330 for exposing the electrode pads 220.

Then, a circuit layer 34 is formed on the insulating layer 33 for electrically connecting the electrode pads 220. In an embodiment, the circuit layer 34 has a plurality of conductive pads 340 that are lower than the active surfaces 22a of the semiconductor elements 22.

Figure 3B:
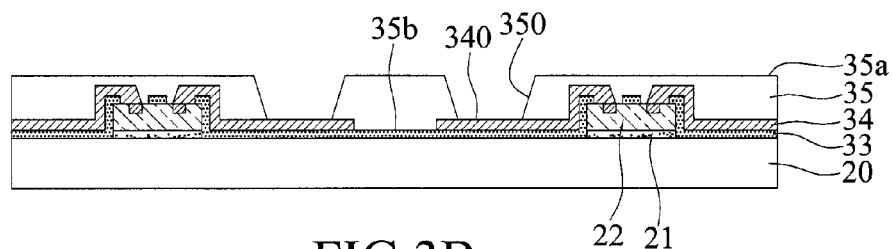

Referring to FIG. 3B, a dielectric layer 35 is formed to encapsulate the semiconductor element 22, the insulating layer 33 and the circuit layer 34. The dielectric layer 35 has a first surface 35a and a second surface 35b opposite to the first surface 35a. The dielectric layer 35 is in contact with the insulating layer 33 through the second surface 35b thereof. The dielectric layer 35 can be made of polyimide (PI) or benzocyclobutene (BCB).

A plurality of openings 350 are further formed in the first surface 35a of the dielectric layer 35 for exposing the conductive pads 340.

Figure 3C:
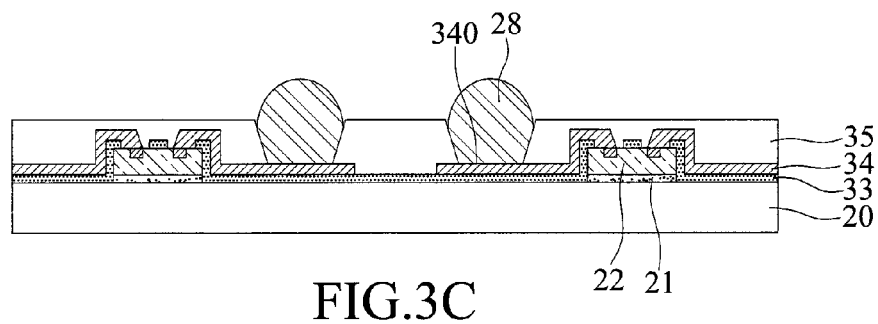

Referring to FIG. 3C, a plurality of conductive elements such as solder balls 28 are formed on the conductive pads 340.

Figure 3D:
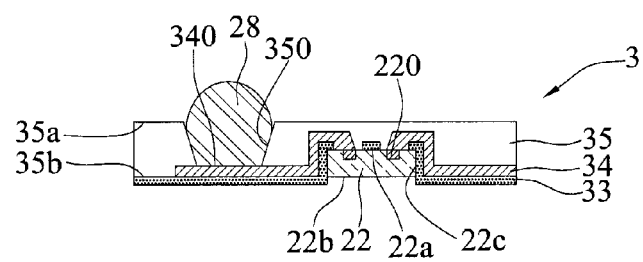
Figure 3D:
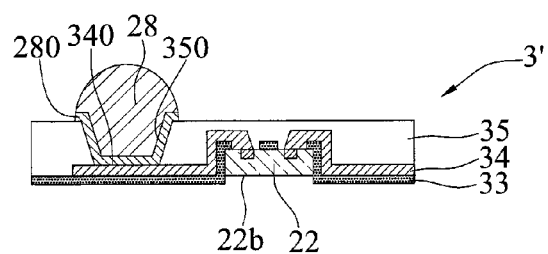

Referring to FIG. 3D, the carrier 20 and the connection units 21 are removed to expose the non-active surfaces 22b of the semiconductor elements 22 and the insulating layer 33. The non-active surfaces 22b of the semiconductor elements 22 are not coplanar with the insulating layer 33. Then, a singulation process is performed to form a plurality of semiconductor packages 3.

In another embodiment, referring to FIG. 3D', a UBM layer 280 is formed on each of the conductive pads 340, and a solder ball 28 is further formed on the UBM layer 280.

The present invention further provides a semiconductor package 2, 3, 3', which has: a semiconductor element 22 having an active surface 22a with a plurality of electrode pads 220, a non-active surface 22b opposite to the active surface 22a, and side surfaces 22c connecting the active surface 22a and the non-active surface 22b; an insulating layer 23, 33 formed on the active surface 22a and the side surfaces 22c of the semiconductor element 22 and having a plurality of openings for exposing the electrode pads 220; and a circuit layer 24, 34 formed on the insulating layer 23, 33 and electrically connected to the electrode pads 220.

The insulating layer 23, 33 can be made of silicon dioxide or silicon nitride.

In an embodiment, the semiconductor package 2 further has a dielectric layer 25 formed on the insulating layer 23 and the circuit layer 24 and having a plurality of openings for exposing a portion of the circuit layer 24 so as for a UBM layer 280 to be formed thereon.

In an embodiment, the semiconductor package 2 further has an RDL structure 26 formed on the insulating layer 23 and the circuit layer 24 and electrically connected to the circuit layer 24.

In an embodiment, the semiconductor package 3, 3' further has a dielectric layer 35 encapsulating the semiconductor element 22, the insulating layer 33 and the circuit layer 34, wherein the dielectric layer 35 has opposite first and second surfaces 35a, 35b and is in contact with the insulating layer 33 through the second surface 35b thereof. Further, the insulating layer 33 extends from the active surface 22a of the semiconductor element 22 along the side surfaces 22c of the semiconductor element 22 to the second surface 35b of the dielectric layer 35, and the circuit layer 34 has a plurality of conductive pads 340 formed on the second surface 35b of the dielectric layer 35 and being lower than the active surface 22a of the semiconductor element 22. Furthermore, the first surface 35a of the dielectric layer 35 has a plurality of openings 350 for exposing the conductive pads 340, and a plurality of conductive elements such as solder balls 28 are further formed on the conductive pads 340. The dielectric layer 35 can be made of polyimide (PI) or benzocyclobutene (BCB).

In an embodiment, the non-active surface 22b of the semiconductor element 22 is exposed from the insulating layer 23, 33 and is not coplanar with the insulating layer 23, 33.

Therefore, by forming connection units corresponding in position to the chip areas, the present invention prevents positional deviations from occurring to the semiconductor elements so as to improve the product yield.

The above-described descriptions of the detailed embodiments are only to illustrate the preferred implementation according to the present invention, and it is not to limit the scope of the present invention. Accordingly, all modifications and variations completed by those with ordinary skill in the art should fall within the scope of present invention defined by the appended claims.

What is claimed is:

1. A semiconductor package, comprising:
    a semiconductor element having an active surface with a plurality of electrode pads, a non-active surface opposite to the active surface, and side surfaces connecting the active surface and the non-active surface;
    an insulating layer formed on the active surface and the side surfaces of the semiconductor element and having a plurality of openings for exposing the electrode pads, wherein the non-active surface of the semiconductor element is recessed under a surface of the insulating layer without protruding from the surface of the insulating layer, and the insulating layer is made of silicon dioxide or silicon nitride; and
    a circuit layer formed on the insulating layer and electrically connected to the electrode pads.

2. The semiconductor package of claim 1, wherein the non-active surface of the semiconductor element is exposed from the insulating layer.

3. The semiconductor package of claim 1, further comprising a redistribution layer (RDL) structure formed on the insulating layer and the circuit layer and electrically connected to the circuit layer.

4. The semiconductor package of claim 1, further comprising a dielectric layer formed on the insulating layer and the circuit layer and having a plurality of openings for exposing a portion of the circuit layer so as for an under bump metallurgy (UBM) layer to be formed thereon.

5. The semiconductor package of claim 1, further comprising a dielectric layer encapsulating the semiconductor element, the insulating layer and the circuit layer, wherein the dielectric layer has opposite first and second surfaces and is in contact with the insulating layer through the second surface thereof.

6. The semiconductor package of claim 5, wherein the dielectric layer is made of polyimide (PI) or benzocyclobutene (BCB).

7. The semiconductor package of claim 5, wherein the insulating layer extends from the active surface of the semiconductor element along the side surfaces of the semiconductor element to the second surface of the dielectric layer, and the circuit layer has a plurality of conductive pads formed on the second surface of the dielectric layer and being lower than the active surface of the semiconductor element.

8. The semiconductor package of claim 7, wherein the first surface of the dielectric layer has a plurality of openings for exposing the conductive pads.

9. A method of fabricating a semiconductor package, comprising:
    providing a carrier having a plurality of chip areas defined thereon, and forming a connection unit on each of the chip areas;
    disposing a semiconductor element on each of the connection units that the semiconductor element is disposed completely above the carrier, wherein the semiconductor element has an active surface with a plurality of electrode pads, a non-active surface opposite to the active surface, and side surfaces connecting the active surface and the non-active surface, the semiconductor element being disposed on the connection unit through the non-active surface thereof;

forming an insulating layer on the carrier and the active surfaces and the side surfaces of the semiconductor elements, and exposing the electrode pads from the insulating layer; and forming on the insulating layer a circuit layer electrically connected to the electrode pads.

10. The method of claim 9, wherein the connection units are made of an adhesive material.

11. The method of claim 10, wherein the connection units are formed by screen printing, dispensing or patterning.

12. The method of claim 9, further comprising removing the carrier and the connection units.

13. The method of claim 9, further comprising forming an RDL structure on the insulating layer and the circuit layer in a manner that the RDL structure is electrically connected to the circuit layer.

14. The method of claim 9, further comprising forming a dielectric layer on the insulating layer and the circuit layer, wherein the dielectric layer has a plurality of openings for exposing a portion of the circuit layer so as for a UBM layer to be formed thereon.

15. The method of claim 9, further comprising forming a dielectric layer on the insulating layer and the circuit layer, wherein the dielectric layer has opposite first and second surfaces and is in contact with the insulating layer through the second surface thereof.

16. The method of claim 15, wherein the dielectric layer encapsulates the semiconductor elements, the insulating layer and the circuit layer.

17. The method of claim 15, wherein the insulating layer extends from the active surfaces of the semiconductor elements along the side surfaces of the semiconductor elements to the carrier, and the circuit layer has a plurality of conductive pads formed on the carrier and being lower than the active surfaces of the semiconductor elements.

18. The method of claim 17, further comprising removing the carrier and the connection units.

19. The method of claim 17, wherein the first surface of the dielectric layer has a plurality of openings for exposing the conductive pads.

* * * * *